United States Patent
Liu et al.

(10) Patent No.: US 12,473,643 B2
(45) Date of Patent: Nov. 18, 2025

(54) LOW RESISTIVITY GAPFILL FOR LOGIC DEVICES

(71) Applicant: Applied Materials, Inc., Santa Clara, CA (US)

(72) Inventors: Zhen Liu, Santa Clara, CA (US); Min-Han Lee, San Jose, CA (US); Jie Zhang, Sunnyvale, CA (US); Yongqian Gao, Sunnyvale, CA (US); Tsung-Han Yang, San Jose, CA (US); Rongjun Wang, Dublin, CA (US)

(73) Assignee: Applied Materials, Inc., Santa Clara, CA (US)

(*) Notice: Subject to any disclaimer, the term of this patent is extended or adjusted under 35 U.S.C. 154(b) by 212 days.

(21) Appl. No.: 18/402,079

(22) Filed: Jan. 2, 2024

(65) Prior Publication Data

US 2024/0240314 A1    Jul. 18, 2024

Related U.S. Application Data

(60) Provisional application No. 63/438,938, filed on Jan. 13, 2023, provisional application No. 63/442,652, filed on Feb. 1, 2023.

(51) Int. Cl.
*C23C 14/14* (2006.01)
*C23C 16/06* (2006.01)
*C23C 16/455* (2006.01)
*C23C 16/56* (2006.01)

(52) U.S. Cl.
CPC ........ *C23C 16/45525* (2013.01); *C23C 16/06* (2013.01); *C23C 16/56* (2013.01)

(58) Field of Classification Search
CPC ................... C23C 14/14; C23C 14/58
See application file for complete search history.

(56) References Cited

U.S. PATENT DOCUMENTS

| 5,340,410 A | * | 8/1994 | Endroes | H10F 71/1221 |
| | | | | 136/258 |
| 5,429,973 A | | 7/1995 | Hong | |
| 6,274,402 B1 | * | 8/2001 | Verlinden | H10F 71/121 |
| | | | | 438/57 |
| 7,235,486 B2 | * | 6/2007 | Kori | C23C 16/4401 |
| | | | | 257/E21.585 |

(Continued)

FOREIGN PATENT DOCUMENTS

| CN | 101681815 A | * | 3/2010 | H01L 21/20 |
| CN | 110600435 A | * | 12/2019 | H01L 21/14 |

(Continued)

OTHER PUBLICATIONS

Founta, Valeria, et al., "Properties of ultrathin molybdenum films for interconnect applications". Materialia vol. 24, Aug. 2022, 101511, pp. 1-14.*

(Continued)

*Primary Examiner* — Bret P Chen
(74) *Attorney, Agent, or Firm* — SERVILLA WHITNEY LLC

(57) ABSTRACT

Embodiments of the disclosure relate to methods for metal gapfill of a logic device with lower resistivity. Specific embodiments provide integrated separate tungsten PVD processes with plasma-etch to solve the overhang issue caused by tungsten PVD and the high resistivity caused by nucleation.

20 Claims, 4 Drawing Sheets

(56) References Cited

U.S. PATENT DOCUMENTS

| | | | |
|---|---|---|---|
| 7,723,755 B2 | 5/2010 | Lee et al. | |
| 8,309,448 B2 | 11/2012 | Hwang et al. | |
| 8,575,040 B2 | 11/2013 | Fucsko et al. | |
| 11,373,862 B2 | 6/2022 | Abel et al. | |
| 2005/0136684 A1* | 6/2005 | Mukai | H01L 21/02271 257/E21.546 |
| 2006/0009034 A1 | 1/2006 | Lai et al. | |
| 2006/0043593 A1* | 3/2006 | Mori | G01R 1/06711 257/758 |
| 2006/0046508 A1 | 3/2006 | Nemani et al. | |
| 2006/0264031 A1* | 11/2006 | Xi | C23C 16/0272 257/E21.171 |
| 2007/0020923 A1 | 1/2007 | Kraus et al. | |
| 2007/0045854 A1 | 3/2007 | Lim et al. | |
| 2011/0298062 A1 | 12/2011 | Ganguli et al. | |
| 2012/0142198 A1 | 6/2012 | Wang et al. | |
| 2013/0149462 A1 | 6/2013 | Liang et al. | |
| 2013/0288485 A1 | 10/2013 | Liang et al. | |
| 2015/0325475 A1* | 11/2015 | Bamnolker | H01L 21/28556 438/680 |
| 2017/0104061 A1 | 4/2017 | Peng et al. | |
| 2017/0350013 A1* | 12/2017 | Chan | C23C 16/08 |
| 2018/0053660 A1 | 2/2018 | Jandl et al. | |
| 2018/0175214 A1 | 6/2018 | Chen et al. | |
| 2019/0067094 A1* | 2/2019 | Zope | H01L 23/53266 |
| 2019/0088797 A1 | 3/2019 | Chen et al. | |
| 2020/0135849 A1* | 4/2020 | Chiang | H10D 64/017 |
| 2020/0248303 A1 | 8/2020 | Cheng et al. | |
| 2020/0303250 A1* | 9/2020 | Cen | H01L 21/32136 |
| 2021/0134992 A1* | 5/2021 | Lu | H10D 62/80 |
| 2022/0037147 A1 | 2/2022 | Kim et al. | |
| 2022/0072707 A1 | 3/2022 | Fan | |
| 2024/0087955 A1* | 3/2024 | Xu | C23C 16/06 |

FOREIGN PATENT DOCUMENTS

| | | | | |
|---|---|---|---|---|
| DE | 102019121191 A1 * | 2/2020 | | H01L 23/50 |
| EP | 2393118 A1 | 12/2011 | | |
| JP | 2002-511191 A * | 4/2002 | | H01L 21/768 |
| KR | 20090000464 A | 1/2009 | | |
| KR | 20150121858 A | 10/2015 | | |
| TW | 201120959 A * | 6/2011 | | C23C 16/06 |
| WO | 2021035236 A1 | 2/2021 | | |

OTHER PUBLICATIONS

Xiao, Shaoqing, et al., "Atomic-layer soft plasma etching of MoS2". Scientific Reports, vol. 6, Article No. 19945 (2016) pp. 1-8.*

Takei, Satoshi, et al., "Characterization of Gap Fill Materials for Planarizing Substrate in Via-First Dual Damascene Lithography Process". Japanese Journal of Applied Physics vol. 46, No. 9A, 2007, pp. 5755-5761.*

Chen, Min-Hui, et al., "Develop Gap-fill Process of Shallow Trench Isolation in 450mm Wafer by Advanced Flowable CVD Technology for Sub-20nm Node", ASMC—978-1-5090-0270, Feb. 16, 2016, 157-159.

Givens, Michael, et al., "How Atomic Layer Deposition Impacts the Logic & Memory Industries", ASM, Nov. 16, 2022.

Lai, Chun Chi, et al., "Influence of Plasma Power and Sputtering Agent on Gap-Fill and MOSFET Performances in HDP-CVD STI Oxide Process", 2014 IEEE—978-1-4799-4780, May 14, 2014.

Lai, Chun Chi, et al., "Superior PSZ-SOD Gap-Fill Process Integration Using Ultra-Low Dispensation Amount in STI for 28nm NAND Flash Memory and Beyond", Hindawi Publishing Corporation—Journal of Nanomaterials—vol. 2015, Article ID 910367, 7 pages, Apr. 15, 2015.

Lai, Chun Chi, et al., "The improvement of MOSFET performance by the optimization of STI HDP-CVD integration process", Microelectronic Engineering 149 (2016) 9-13, Aug. 28, 2015.

Radecker, Jorg, et al., "Extending the HDP-CVD Technology to the 90nm Node and Beyond with an In-Situ Etch Assisted (ISEA) HDP-CVD Process", 2003 IEEE/SEMI Advanced Manufacturing Conference, 125-130.

PCT International Search Report and Written Opinion in PCT/US2024/010098 dated May 1, 2024, 10 pages.

* cited by examiner

LOW RESISTIVITY GAPFILL FOR LOGIC DEVICES

CROSS-REFERENCE TO RELATED APPLICATIONS

This application claims priority to U.S. Provisional Application No. 63/438,938, filed Jan. 13, 2023, and to U.S. Provisional Application No. 63/442,652, filed Feb. 1, 2023, the entire disclosures of which are hereby incorporated by reference herein.

TECHNICAL FIELD

Embodiments of the present disclosure pertain to methods for deposition of metal gapfill within substrate features. More particularly, embodiments of the disclosure are directed to methods which provide gapfill with improved resistivity.

BACKGROUND

Gapfill processes are integral to several semiconductor manufacturing processes. A gapfill process can be used to fill a gap (or feature) with an insulating or conducting material. For example, shallow trench isolation, inter-metal dielectric layers, passivation layers, dummy gate, are all typically implemented by gapfill processes.

As device geometries continue to shrink (e.g., critical dimensions<20 nm, <10 nm, and beyond), decreased metal volumes create higher resistivity for metal interconnects.

Typically, for tungsten gapfill, a nucleation layer comprising silicon or boron is deposited on top of PVD tungsten liners before forming a tungsten bulk fill to promote the formation/growth of the bulk fill on the PVD liner. These nucleation layers, however, lead to the formation of a relatively high resistance stack due to the presence of boron tungsten (BW) and/or tungsten silicide (WSi). Additionally, the overhang effect by tungsten physical vapor deposition (WPVD) is problematic, limiting gapfill performance. Accordingly, there is a need for gapfill methods which provide lower resistivity.

SUMMARY

One or more embodiments of the disclosure are directed to a method of forming a logic device, the method comprising: depositing a first metal layer on a substrate surface by physical vapor deposition (PVD), the substrate surface comprising at least one feature extending a depth from the substrate surface to a bottom and having two sidewalls; exposing the first metal layer to a nucleation presoak to form a nucleation layer on the first metal layer; exposing the nucleation layer to a plasma to etch the nucleation layer; depositing a second metal layer on the nucleation layer by physical vapor deposition (PVD); and depositing a metal gapfill on the second metal layer to fill the at least one feature and form a metal stack.

Further embodiments of the disclosure are directed to a method of forming a semiconductor device, the method comprising: depositing a first metal layer comprising tungsten (W) on a substrate surface by physical vapor deposition (PVD), the substrate surface comprising at least one feature extending a depth from the substrate surface to a bottom and having two sidewalls; exposing the first metal layer to a nucleation presoak comprising boron to form a boron nucleation layer; exposing the boron nucleation layer to a plasma to etch the boron nucleation layer; depositing a second metal layer comprising tungsten (W) on the boron nucleation layer by physical vapor deposition (PVD); and depositing a metal gapfill comprising tungsten (W) on the second metal layer to fill the at least one feature and form a metal stack.

BRIEF DESCRIPTION OF THE DRAWINGS

So that the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments. The embodiments as described herein are illustrated by way of example and not limitation in the figures of the accompanying drawings in which like references indicate similar elements.

DETAILED DESCRIPTION

Figure 1:
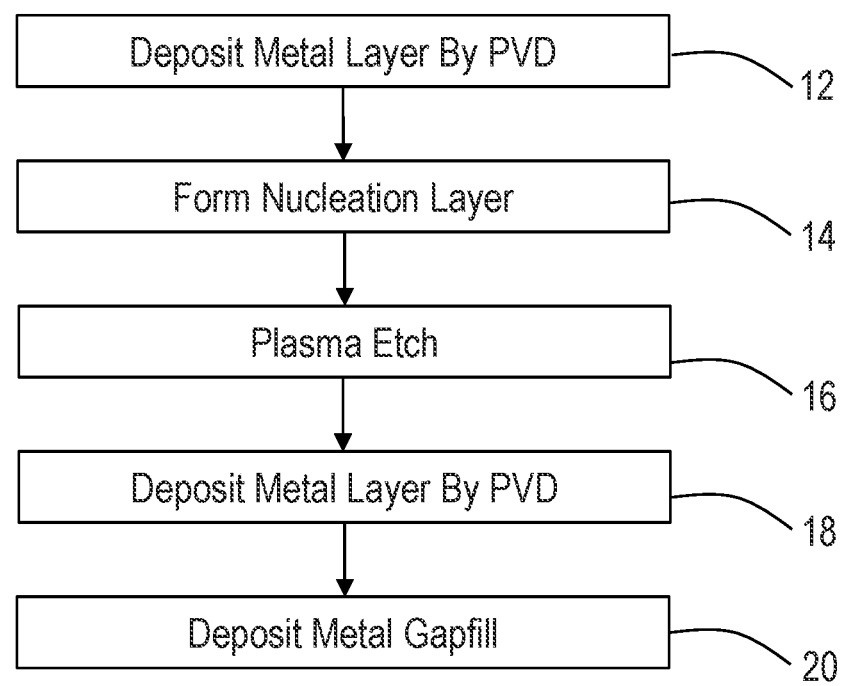
FIG. 1 illustrates a process flow diagram of a deposition method according to one or more embodiments.

Before describing several exemplary embodiments of the disclosure, it is to be understood that the disclosure is not limited to the details of construction or process steps set forth in the following description. The disclosure is capable of other embodiments and of being practiced or being carried out in various ways.

The term "about" as used herein means approximately or nearly and in the context of a numerical value or range set forth means a variation of ±15% or less, of the numerical value. For example, a value differing by ±14%, ±10%, ±5%, ±2%, ±1%, ±0.5%, or ±0.1% would satisfy the definition of "about."

As used in this specification and the appended claims, the term "substrate" or "wafer" refers to a surface, or portion of a surface, upon which a process acts. It will also be understood by those skilled in the art that reference to a substrate can refer to only a portion of the substrate unless the context clearly indicates otherwise. Additionally, reference to depositing on a substrate can mean both a bare substrate and a substrate with one or more films or features deposited or formed thereon.

A "substrate surface" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an under-layer formed on the substrate as disclosed in more detail below, and the term "substrate surface" is intended to include such under-layer as the context indicates. Thus, for example, where a film/layer or partial film/layer has been deposited onto a substrate surface, the exposed surface of the newly deposited film/layer becomes the substrate surface.

The substrate surface may have one or more features formed therein, one or more layers formed thereon, and combinations thereof. The shape of the feature can be any suitable shape including, but not limited to, trenches, holes, and vias (circular or polygonal). As used in this regard, the term "feature" refers to any intentional surface irregularity. Suitable examples of features include but are not limited to trenches, which have a top, two sidewalls and a bottom extending into the substrate, and vias which have one or more sidewall extending into the substrate to a bottom.

The term "on" indicates that there is contact between elements, and there may be intervening elements or layers. The term "directly on" indicates that there is direct contact between elements with no intervening elements.

As used in this specification and the appended claims, the terms "precursor," "reactant," "reactive gas" and the like are used interchangeably to refer to any gaseous species that can react with the substrate surface.

"Atomic layer deposition" or "cyclical deposition" as used herein refers to the sequential exposure of two or more reactive compounds to deposit a layer of material on a substrate surface. The substrate, or portion of the substrate, is exposed separately to the two or more reactive compounds which are introduced into a reaction zone of a processing chamber. In a time-domain ALD process, exposure to each reactive compound is separated by a time delay to allow each compound to adhere and/or react on the substrate surface and then be purged from the processing chamber. These reactive compounds are said to be exposed to the substrate sequentially. In a spatial ALD process, different portions of the substrate surface, or material on the substrate surface, are exposed simultaneously to the two or more reactive compounds so that any given point on the substrate is substantially not exposed to more than one reactive compound simultaneously. As used in this specification and the appended claims, the term "substantially" used in this respect means, as will be understood by those skilled in the art, that there is the possibility that a small portion of the substrate may be exposed to multiple reactive gases simultaneously due to diffusion, and that the simultaneous exposure is unintended.

In one aspect of a time-domain ALD process, a first reactive gas (i.e., a first precursor or compound A) is pulsed into the reaction zone followed by a first time-delay. Next, a second precursor or compound B is pulsed into the reaction zone followed by a second delay. During each time delay, a purge gas, such as argon, is introduced into the processing chamber to purge the reaction zone or otherwise remove any residual reactive compound or reaction by-products from the reaction zone. Alternatively, the purge gas may flow continuously throughout the deposition process so that only the purge gas flows during the time delay between pulses of reactive compounds. The reactive compounds are alternatively pulsed until a desired film or film thickness is formed on the substrate surface. In either scenario, the ALD process of pulsing compound A, purge gas, compound B and purge gas is a cycle. A cycle can start with either compound A or compound B and continue the respective order of the cycle until achieving a film with the predetermined thickness.

In an embodiment of a spatial ALD process, a first reactive gas and second reactive gas (e.g., nitrogen gas) are delivered simultaneously to the reaction zone but are separated by an inert gas curtain and/or a vacuum curtain. The substrate is moved relative to the gas delivery apparatus so that any given point on the substrate is exposed to the first reactive gas and the second reactive gas.

As used herein, "chemical vapor deposition" refers to a process in which a substrate surface is exposed to precursors and/or co-reagents simultaneous or substantially simultaneously. As used herein, "substantially simultaneously" refers to either co-flow or where there is overlap for a majority of exposures of the precursors.

Plasma enhanced chemical vapor deposition (PECVD) is widely used to deposit films due to cost efficiency and film property versatility. In a PECVD process, for example, a hydrocarbon source, such as a gas-phase hydrocarbon or a vapor of a liquid-phase hydrocarbon that have been entrained in a carrier gas, is introduced into a PECVD chamber. A plasma-initiated gas, typically helium, is also introduced into the chamber. Plasma is then initiated in the chamber to create excited CH-radicals. The excited CH-radicals are chemically bound to the surface of a substrate positioned in the chamber, forming the desired film thereon. Embodiments described herein in reference to a PECVD process can be carried out using any suitable thin film deposition system. Any apparatus description described herein is illustrative and should not be construed or interpreted as limiting the scope of the embodiments described herein.

As used herein, "physical vapor deposition" (PVD) refers to a variety of vacuum deposition methods which can be used to produce thin films and coatings on substrates including metals, ceramics, glass, and polymers. PVD is characterized by a process in which the material transitions from a condensed phase to a vapor phase and then back to a thin film condensed phase.

Boron tungsten (BW) nucleation processes are currently used to allow good sidewall coverage, but boron tungsten (BW) nucleation processes result in a resistivity penalty due to the introduction of boron. Additionally, the overhang effect by tungsten physical vapor deposition (WPVD) is problematic, limiting gap-fill performance. In one or more embodiments, separate WPVD processes are advantageously integrated with plasma-etch to solve the overhang issue by WPVD and high resistivity by nucleation, thus, providing a good gap-fill in a logic feature with low resistivity. In one or more embodiments, the separate WPVD process allow a smaller overhang in the feature. Also, the second WPVD layer serves as the seeding layer for bulk W deposition, which leads to a lower resistivity. In one or more embodiments, a BW Nucleation process is included, which provides a better sidewall step-coverage in the feature. To further decrease the stack resistivity, plasma-etch is included in the process to clean the WPVD film.

The embodiments of the disclosure are described by way of the Figures, which illustrate devices (e.g., logic devices) and processes for forming devices in accordance with one or more embodiments of the disclosure. The processes shown are merely illustrative possible uses for the disclosed processes, and the skilled artisan will recognize that the disclosed processes are not limited to the illustrated applications.

Example embodiments are described herein with reference to cross-sectional illustrations that are schematic illustrations of example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but may be to include deviations in shapes that result, for example, from manufacturing. Thus, the regions illustrated in the figures are schematic in nature and their shapes may be not intended to illustrate the actual shape of a region of a device and are not intended to limit the scope of example embodiments.

FIG. 1 illustrates a process flow diagram for a method 10 for forming a semiconductor device in accordance with one or more embodiments of the present disclosure. FIGS. 2A-2F illustrate cross-sectional views of a semiconductor device according to one or more embodiments. The method 10 is described below with respect to FIGS. 2A-2F. The method 10 may be part of a multi-step fabrication process of a semiconductor device.

In one or more embodiments, the method 10 may be performed in any suitable process chamber coupled to a cluster tool. The cluster tool may include process chambers for fabricating a semiconductor device, such as chambers configured for etching, deposition, physical vapor deposition (PVD), chemical vapor deposition (CVD), oxidation, or any other suitable chamber used for the fabrication of a semiconductor device.

Referring to FIG. 1, at operation 12 of method 10, a metal layer is deposited using PVD. At operation 14, a nucleation layer is formed on the metal layer. At operation 16, the substrate is etched with a plasma. At operation 18, a second metal layer is deposited. At operation 20, a metal gapfill is deposited.

Figure 2A:
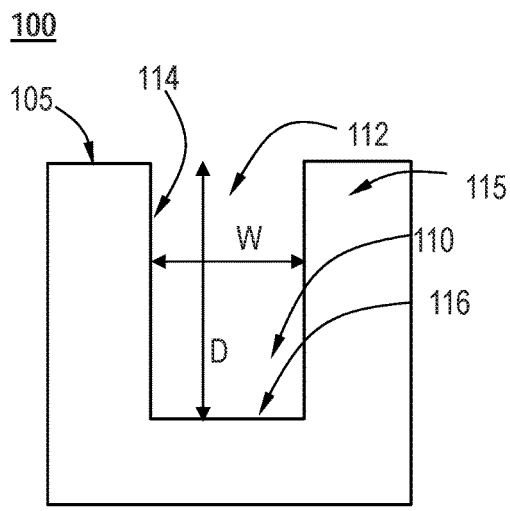
FIG. 2A illustrates a cross-sectional view of a substrate during processing according to one or more embodiments.

FIG. 2A illustrates a substrate 100 with a substrate surface 105. As identified above, the substrate surface refers to the exposed surface of the substrate upon which a layer may be formed. The substrate surface 105 has at least one feature 110 formed therein. While only a single feature is shown in the Figures, one skilled in the art will recognize that a plurality of features will be affected by the disclosed methods, each in a similar manner.

The at least one feature 110 has an opening 112 with a width W. The opening 112 is formed in a top surface 115 of the substrate 100. The feature 110 also has one or more sidewall 114 and extends a depth D from the top surface 115 to the bottom 116. While straight, vertical sidewalls are shown in the Figures, the disclosed methods may also be performed on slanted, irregular, or reentrant sidewalls.

In one or more embodiments, the width W of the opening 112 is greater than or equal to about 10 nm, greater than or equal to about 15 nm, greater than or equal to about 20 nm, greater than or equal to about 25 nm, greater than or equal to about 30 nm, or greater than or equal to about 35 nm. In one or more embodiments, the width W is in a range of about 5 nm to about 15 nm, or in a range of about 10 nm to about 35 nm.

In one or more embodiments, the depth D of the feature 110 is greater than or equal to about 50 nm, greater than or equal to about 75 nm, greater than or equal to about 100 nm, greater than or equal to about 150 nm, greater than or equal to about 200 nm, or greater than or equal to about 250 nm. In one or more embodiments, the depth D is in a range of about 50 nm to about 250 nm, or in a range of about 200 nm to about 250 nm.

Those skilled in the art will recognize the increasing challenge of depositing metal gapfill in features of narrowing width (also known as critical dimension (CD)) and/or increasing depth. The aspect ratio of the at least one feature 110 is defined as the depth D of the feature 110 divided by the width W. In one or more embodiments, the at least one feature has an aspect ratio (D:W) greater than or equal to about 2:1, greater than or equal to about 5:1, greater than or equal to about 10:1, or greater than or equal to about 20:1.

Figure 2B:
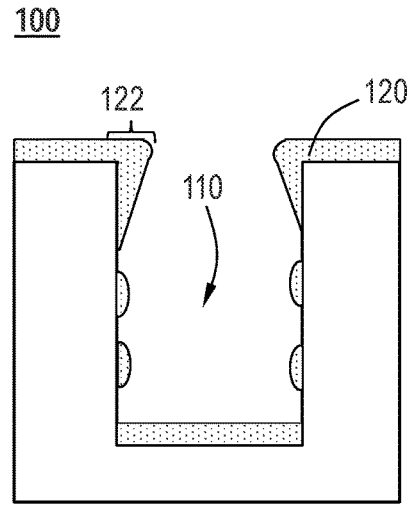
FIG. 2B illustrates a cross-sectional view of a substrate during processing according to one or more embodiments.

Referring to FIGS. 1 and 2B, the method 10 begins with operation 12, where a metal layer 120 is deposited on the substrate surface 105. In one or more embodiments, the metal layer 120 is deposited by a physical vapor deposition process. In one or more embodiments, as shown in FIG. 2B, the metal layer 120 is non-continuous and deposited on the top surface 115, the sidewalls 114 and the bottom 116 of the substrate surface 105. In one or more embodiments, the metal layer 120 only partially covers the sidewalls 114 of the at least one feature 110.

In one or more embodiments, the metal layer 120 forms on the top surface 115 of the substrate surface with an overhang 122 that extends partially into the opening 112 of the at least one feature 110. In one or more embodiments, the average thickness of the overhang 122 of the metal layer 120 is less than or equal to about 50 Å, or less than or equal to about 20 Å.

In one or more embodiments, the metal layer 120 may comprise any suitable material known to the skilled artisan. In one or more embodiments, the metal layer 120 comprises tungsten (W).

Figure 2C:
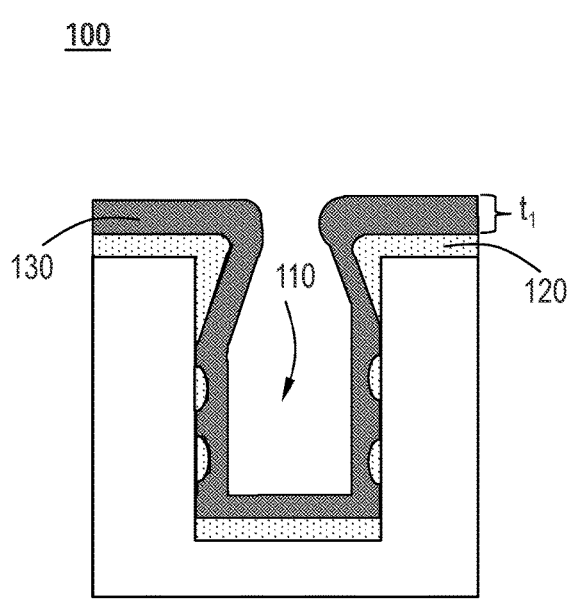
FIG. 2C illustrates a cross-sectional view of a substrate during processing according to one or more embodiments.

Referring to FIGS. 1 and 2C, at operation 14, a nucleation layer 130 is formed on the metal layer 120 and within the at least one feature 110. In one or more embodiments, as shown in FIG. 2O, the nucleation layer 130 is continuous and deposited on all surfaces of the metal layer 120 and on the sidewall 114 and the bottom of the at least one feature 110.

At operation 14, the nucleation layer 130 may be formed by exposing the substrate to a nucleation presoak. In one or more embodiments, the nucleation presoak comprises a silicon compound. In one or more embodiments, the nucleation presoak comprises a boron compound. As used herein, a "silicon compound" or a "boron compound" is any material capable of forming a layer of silicon or boron, respectively, on the metal layer 120.

In one or more embodiments, the silicon compound comprises or consists essentially of silane ($SiH_4$), disilane, trislane, tertrasilane, cyclopentasilane, or cyclohexasilane. In one or more embodiments, the boron compound comprises or consists essentially of borane, diborane ($B_2H_6$), triborane, tetraborane, or cycloboranes. As used in this regard, a process gas which "consists essentially of" a stated material comprises greater than about 95%, greater than about 98%, greater than about 99%, or greater than about 99.5% of the stated material on a molar basis, excluding any inert diluent or carrier gases.

In one or more embodiments, the first metal layer 120 is exposed to a nucleation presoak comprising boron to form a boron nucleation layer. In other embodiments, the first metal layer 120 is exposed to a nucleation presoak comprising silicon to form a silicon nucleation layer.

In one or more embodiments, the nucleation layer 130 is substantially conformal. As used in this regard, a layer which is "substantially conformal" has an average thickness which varies by less than 10%, less than 5% or less than 2% of the average thickness of the layer. In one or more embodiments, the nucleation layer 130 has an average thickness of less than 10 Å or less than 5 Å. In one or more embodiments, the nucleation layer 130 comprises one to two monolayers of silicon and/or boron.

In one or more embodiments, operation 14, forming the nucleation layer 130, represents a chemical vapor deposition (CVD) process. In one or more embodiments, the temperature of the CVD process is in a range of about 250° C. to about 450° C., in a range of about 250° C. to about 350° C., or in a range of about 350° C. to about 450° C. In one or more embodiments, the CVD process is performed without plasma.

Figure 2D:
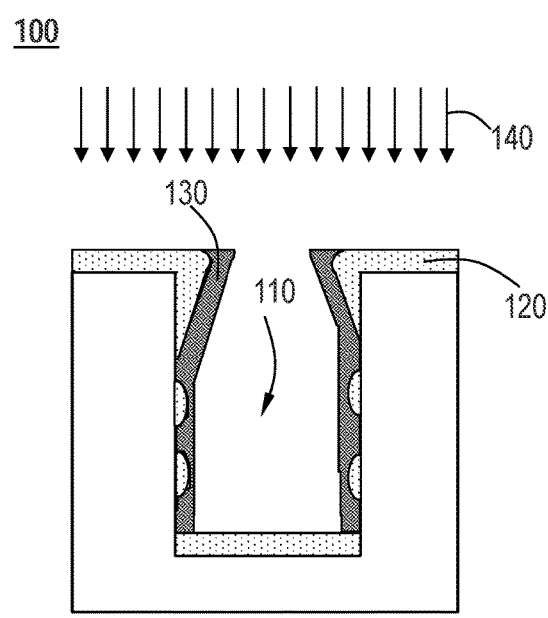
FIG. 2D illustrates a cross-sectional view of a substrate during processing according to one or more embodiments.

Referring to FIG. 1 and FIG. 2D, the method 10 continues at operation 16, where the device is exposed to a plasma 140 to etch the nucleation layer 130. In some embodiments, the plasma 140 cleans the nucleation layer 130 and removes a portion of the nucleation layer 130. In one or more embodiments, the plasma 140 etching removes a portion of the nucleation layer 130 from the top, sidewall, and bottom of the at least one feature 110. In one or more embodiments, etching the nucleation layer 130 completely removes the nucleation layer from the top surface of the substrate surface 105 and from the bottom 116 of the at least one feature, exposing the metal layer 120. In one or more embodiments, etching the nucleation layer 130 decreases the thickness of the nucleation layer 130 on the sidewalls 114. In some embodiments, the thickness of the nucleation layer 130 is reduced by about 10 Å. In some embodiments, the plasma 140 etch may remove a portion of the nucleation layer 130 from the metal layer 120 overhang 122.

In some embodiments, the etch process may include a conventional plasma etch, or a remote plasma-assisted dry etch process, such as a SiCoNi™ etch process, available from Applied Materials, Inc., located in Santa Clara, Calif. In a SiCoNi™ etch process, the device is exposed to Ar, $H_2$, $NF_3$, and/or $NH_3$ plasma species, e.g., plasma-excited hydrogen and fluorine species. For example, in some embodiments, the device may undergo simultaneous exposure to Ar, $H_2$, $NF_3$, and $NH_3$ plasma. The SiCoNi™ etch process may be performed in a SiCoNi™ Preclean chamber, which may be integrated into one of a variety of multi-processing platforms as known to the skilled artisan. The plasma processes can be any suitable plasma (e.g., conductively coupled plasma, inductively coupled plasma, microwave plasma).

In one or more embodiments, the plasma etch process of operation 16 advantageously decreases the concentration of boron in the nucleation layer. In some embodiments, prior to plasma etching, the nucleation layer 130 has a Boron concentration in a range of from 3% to 7%, including in a range of from 4% to 6%. In one or more embodiments, after the plasma etch process of operation 16, the nucleation layer 130 has a boron concentration in a range of from >0% to 3%, including in a range of from 0.5% to 2.5%. Decreasing the concentration of boron in the nucleation layer 130 advantageously results in lower resistivity for the metal stack of the logic device.

Figure 2E:
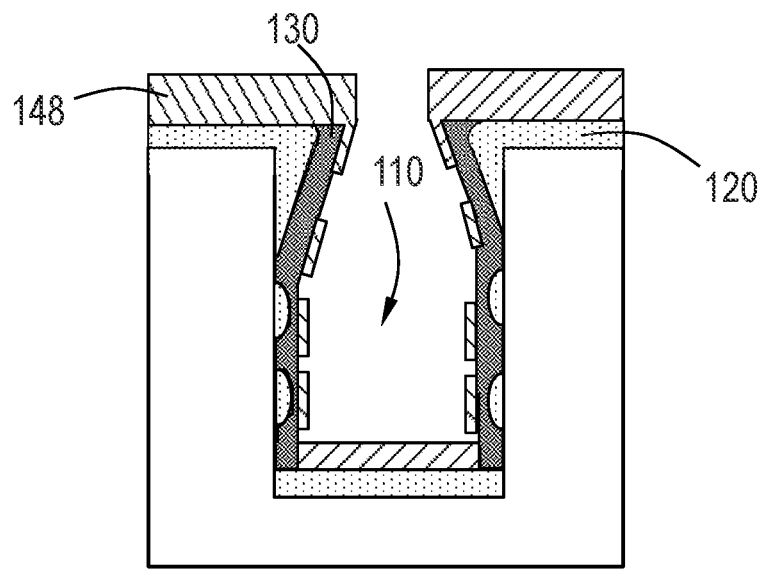
FIG. 2E illustrates a cross-sectional view of a substrate during processing according to one or more embodiments.

The method 10 continues at operation 18 with formation of a second metal layer 148. In one or more embodiments, the second metal layer 148 is deposited by a physical vapor deposition process. In one or more embodiments, as shown in FIG. 2E, the second metal layer 148 is not continuous when deposited on the nucleation layer 130 on the sidewalls 114 of the at least one feature 110.

In one or more embodiments, the second metal layer 148 has an average thickness of less than 50 Å, or less than 30 Å, or less than 10 Å. In one or more embodiments, the thickness of the second metal layer 148 is greater than the thickness of the first metal layer 120.

In one or more embodiments, the second metal layer 148 may comprise any suitable material known to the skilled artisan. In one or more embodiments, the metal layer 148 comprises tungsten (W).

Figure 2F:
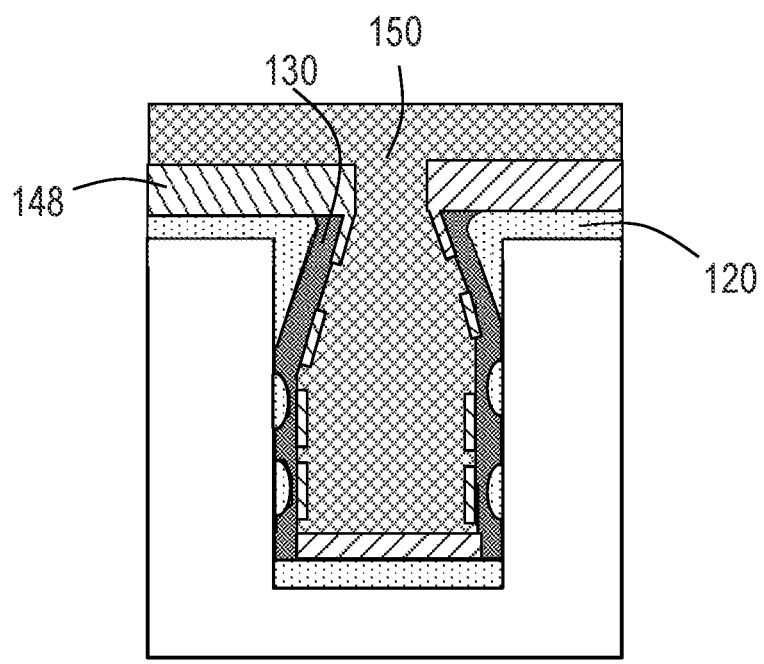
FIG. 2F illustrates a cross-sectional view of a substrate during processing according to one or more embodiments.

Referring to FIGS. 1 and 2F, the method 10 continues at operation 20, where a metal gapfill 150 is deposited on the second metal layer 148. In one or more embodiments, the metal gapfill 150 is deposited by an atomic layer deposition (ALD) process. In one or more embodiments, the metal gapfill 150 is deposited by a chemical vapor deposition (CVD) process. In one or more embodiments, the metal gapfill 150 is deposited by an atomic layer deposition (ALD) process followed by a chemical vapor deposition (CVD) process.

In one or more embodiments, the metal gapfill 150 is formed directly on the metal layer 148. As stated above, without being bound by theory, it is believed that the disclosed methods provide metal gapfill without the use or formation of a high resistance nucleation layer. In one or more embodiments, the metal layer 148 and the metal gapfill 150 are referred to as a metal stack. In one or more embodiments, the nucleation layer 130 does not increase the resistance of the metal stack. In one or more embodiments, it has been surprisingly found that the presence of the nucleation layer 130 does not adversely affect the adhesion of the metal stack to the underlying substrate. Additionally, in one or more embodiments, the plasma etch process following the nucleation process, cleans the nucleation layer, which further causes resistivity reduction. Overall, with the combination of separated WPVD processes and plasma etch process, a total of at least 25% resistivity reduction can be achieved with a 130 Å film. In one or more embodiments, because the deposition of the first and second metal layers 120, 148, e.g., WPVD layers, are non-continuous, the metal gap-fill 150 can be formed either on WPVD layer or plasma-etched nucleation layer. With the etching process of one or more embodiments, the nucleation layer 130 will NOT increase the resistivity of the structure significantly.

The gap filling process may comprise any suitable gap filling process known to the skilled artisan. For example, in one or more embodiments, the gap filling process may be an atomic layer deposition process. In other embodiments, the gap filling process may be a chemical vapor deposition process. In one or more embodiments, the gap filling process comprises exposing the semiconductor structure 100, specifically the logic structure, to a metal precursor and a reactant. In some embodiments, the metal precursor comprises one or more of a molybdenum precursor, a tungsten precursor, a cobalt precursor, and a ruthenium precursor. In one or more specific embodiments, the metal precursor comprises a tungsten precursor, and the metal gapfill 150 comprises tungsten (W).

In some embodiments, the gap filling process is a bottom-up gap filling process. In other embodiments, the gap filling process comprises a conformal gap filling process.

Embodiments of the disclosure advantageously provide metal films (e.g., the metal gapfill 150) that are free or substantially free of voids and seams. As used in this regard, "substantially free" means that less than about 5%, including less than about 4%, less than about 3%, less than about 2%, less than about 1%, less than about 0.5%, and less than about 0.1% of the total composition of the conformally deposited metal film (e.g., the metal gapfill 150), on an atomic basis, comprises voids and/or seams.

The methods described herein may be performed in any suitable processing chamber known to the skilled artisan. In some embodiments, the operations of the methods described herein are each performed within the same processing chamber or within the same processing system. In some embodiments, the operations of the methods described herein are each performed within a different processing chamber. In some embodiments, the different processing chambers are connected as part of a processing system. In some embodiments, the operations of the methods described herein are each performed within a different processing chamber, and each different processing chamber is part of a separate processing system. In some embodiments, the operations of the methods described herein are performed without an intervening vacuum break.

In one or more embodiments, one or more of the operations of the methods described herein is performed in situ without breaking vacuum. In some embodiments, one or more of the operations of the methods described herein is performed ex situ. As used herein, the term "in situ" refers to operations of the methods described herein that are each performed in the same processing chamber or a different processing chamber that is connected as part of a processing system, such that each of the operations of the methods described herein are performed without an intervening vacuum break. As used herein, the term "ex situ" refers to operations of the methods described herein that are each performed in the same processing chamber or a different processing chamber such that one or more of the operations of the methods described herein are performed with an intervening vacuum break.

Figure 3:
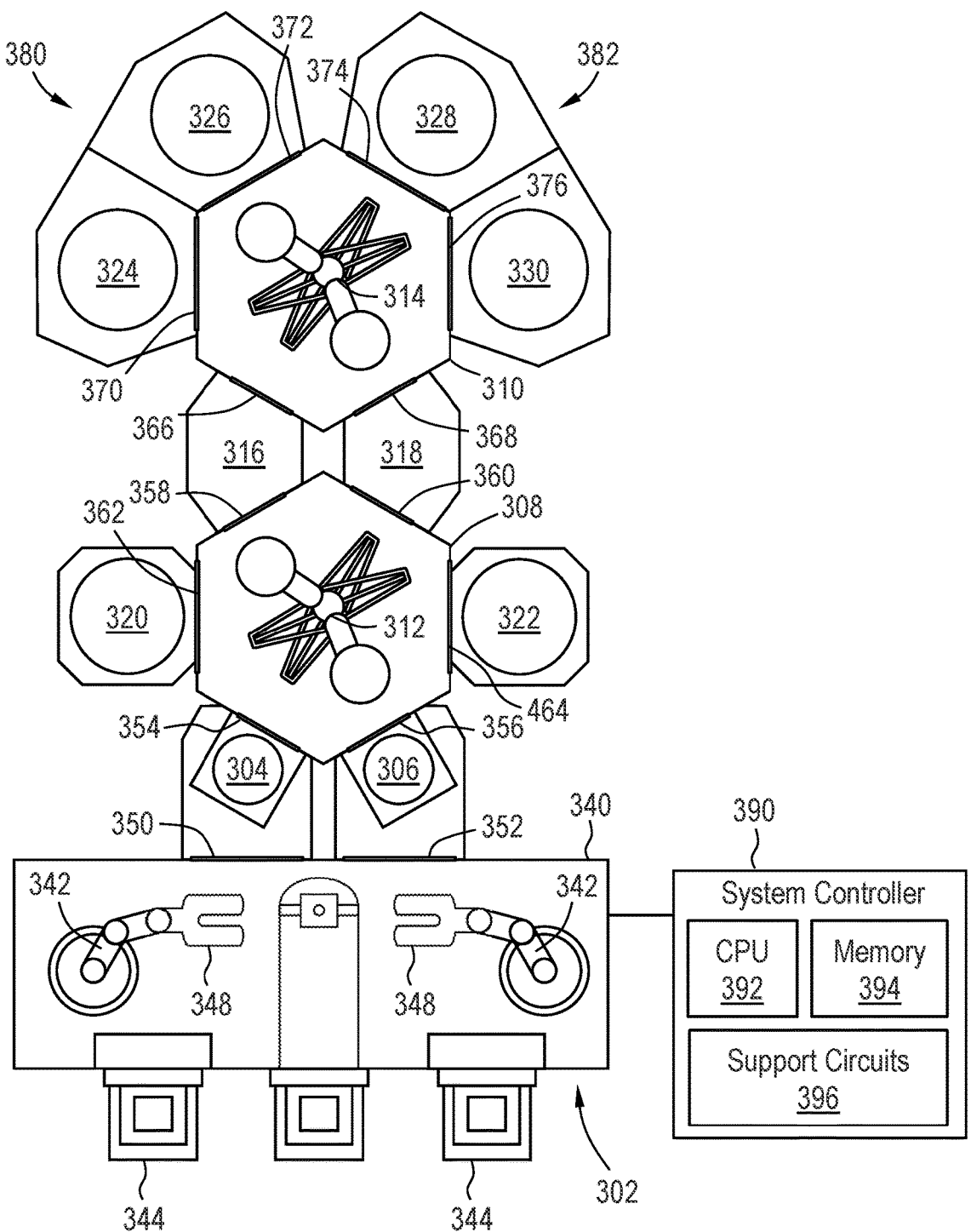
FIG. 3 illustrates a schematic top-view diagram of a multi-chamber processing system according to one or more embodiments.

FIG. 3 is a schematic top-view diagram of an exemplary multi-chamber processing system 300 according to embodiments of the present disclosure. The processing system 300 generally includes a factory interface 302, load lock chambers 304, 306, transfer chambers 308, 310 with respective transfer robots 312, 314, holding chambers 316, 318, and processing chambers 320, 322, 324, 326, 328, 330. As detailed herein, wafers in the processing system 300 can be processed in and transferred between the various chambers without exposing the wafers to an ambient environment exterior to the processing system 300 (e.g., an atmospheric ambient environment such as may be present in a fab). For example, the wafers can be processed in and transferred between the various chambers in a low pressure (e.g., less than or equal to about 300 Torr) or vacuum environment without breaking the low pressure or vacuum environment between various processes performed on the wafers in the processing system 300. Accordingly, the processing system 300 may provide an integrated solution for some processing of wafers.

Examples of a processing system that may be suitably modified in accordance with the teachings provided herein include integrated processing systems or other suitable processing systems known to the skilled artisan. It is contemplated that other processing systems may be adapted to benefit from aspects described herein.

In the illustrated example of FIG. 3, the factory interface 302 includes a docking station 340 and factory interface robots 342 to facilitate transfer of wafers. The docking station 340 is configured to accept one or more front opening unified pods (FOUPs) 344. In some examples, each factory interface robot 342 generally comprises a blade 348 disposed on one end of the respective factory interface robot 342 configured to transfer the wafers from the factory interface 302 to the load lock chambers 304, 306.

The load lock chambers 304, 306 have respective ports 350, 352 coupled to the factory interface 302 and respective ports 354, 356 coupled to the transfer chamber 308. The transfer chamber 308 further has respective ports 358, 360 coupled to the holding chambers 316, 318 and respective ports 362, 364 coupled to processing chambers 320, 322. Similarly, the transfer chamber 310 has respective ports 366, 368 coupled to the holding chambers 316, 318 and respective ports 370, 372, 374, 376 coupled to processing chambers 324, 326, 328, 330. The ports 354, 356, 358, 360, 362, 364, 366, 368, 370, 372, 374, 376 can be, for example, slit valve openings with slit valves for passing wafers therethrough by the transfer robots 312, 314 and for providing a seal between respective chambers to prevent a gas from passing between the respective chambers. Generally, any port is open for transferring a wafer therethrough. Otherwise, the port is closed.

The load lock chambers 304, 306, transfer chambers 308, 310, holding chambers 316, 318, and processing chambers 320, 322, 324, 326, 328, 330 may be fluidly coupled to a gas and pressure control system (not specifically illustrated). The gas and pressure control system can include one or more gas pumps (e.g., turbo pumps, cryo-pumps, roughing pumps), gas sources, various valves, and conduits fluidly coupled to the various chambers. In operation, a factory interface robot 342 transfers a wafer from a FOUP 344 through a port 350 or 352 to a load lock chamber 304 or 306. The gas and pressure control system then pumps down the load lock chamber 304 or 306. The gas and pressure control system further maintains the transfer chambers 308, 310 and holding chambers 316, 318 with an interior low pressure or vacuum environment (which may include an inert gas). Hence, the pumping down of the load lock chamber 304 or 306 facilitates passing the wafer between, for example, the atmospheric environment of the factory interface 302 and the low pressure or vacuum environment of the transfer chamber 308.

With the wafer in the load lock chamber 304 or 306 that has been pumped down, the transfer robot 312 transfers the wafer from the load lock chamber 304 or 306 into the transfer chamber 308 through the port 354 or 356. The transfer robot 312 is then capable of transferring the wafer to and/or between any of the processing chambers 320, 322 through the respective ports 362, 364 for processing and the holding chambers 316, 318 through the respective ports 358, 360 for holding to await further transfer. Similarly, the transfer robot 314 is capable of accessing the wafer in the holding chamber 316 or 318 through the port 366 or 368 and is capable of transferring the wafer to and/or between any of the processing chambers 324, 326, 328, 330 through the respective ports 370, 372, 374, 376 for processing and the holding chambers 316, 318 through the respective ports 366, 368 for holding to await further transfer. The transfer and holding of the wafer within and among the various chambers can be in the low pressure or vacuum environment provided by the gas and pressure control system.

The processing chambers 320, 322, 324, 326, 328, 330 can be any appropriate chamber for processing a wafer. In one or more embodiments, the processing chamber 320 can be capable of performing a nucleation presoak, the processing chamber 322 can be capable of performing a PVD deposition process, and the processing chamber 324 can be capable of performing an ALD and/or CVD deposition process.

A system controller 390 is coupled to the processing system 300 for controlling the processing system 300 or components thereof. For example, the system controller 390 may control the operation of the processing system 300 using a direct control of the chambers 304, 306, 308, 316, 318, 310, 320, 322, 324, 326, 328, 330 of the processing system 300 or by controlling controllers associated with the chambers 304, 306, 308, 316, 318, 310, 320, 322, 324, 326, 328, 330. In operation, the system controller 390 enables data collection and feedback from the respective chambers to coordinate performance of the processing system 300.

The system controller 390 generally includes a central processing unit (CPU) 392, memory 394, and support circuits 396. The CPU 392 may be one of any form of a general-purpose processor that can be used in an industrial setting. The memory 394, or non-transitory computer-readable medium, is accessible by the CPU 392 and may be one or more of memory such as random-access memory (RAM), read only memory (ROM), floppy disk, hard disk, or any other form of digital storage, local or remote. The support circuits 396 are coupled to the CPU 392 and may comprise cache, clock circuits, input/output subsystems, power supplies, and the like. The various methods disclosed herein may generally be implemented under the control of the CPU 392 by the CPU 392 executing computer instruction code stored in the memory 394 (or in memory of a particular process chamber) as, for example, a software routine. When the computer instruction code is executed by the CPU 392, the CPU 392 controls the chambers to perform processes in accordance with the various methods.

Other processing systems can be in other configurations. For example, more or fewer processing chambers may be coupled to a transfer apparatus. In the illustrated example, the transfer apparatus includes the transfer chambers 308, 310 and the holding chambers 316, 318. In other examples, more or fewer transfer chambers (e.g., one transfer chamber) and/or more or fewer holding chambers (e.g., no holding chambers) may be implemented as a transfer apparatus in a processing system.

Processes may generally be stored in the memory of the system controller 390 as a software routine that, when executed by the processor, causes the process chamber to perform processes of the present disclosure. The software routine may also be stored and/or executed by a second processor (not shown) that is remotely located from the hardware being controlled by the processor. Some or all of the methods of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general-purpose computer into a specific purpose computer (controller) that controls the chamber operation such that the processes are performed.

Embodiments of the disclosure are directed to a non-transitory computer readable medium. In one or more embodiments, the non-transitory computer readable medium includes instructions that, when executed by a controller of a processing chamber, causes a processing chamber to perform the operations of any of the methods (e.g., gapfill method 10) described herein. In one or more embodiments, the controller causes a processing chamber to perform the operations of deposition method 10. In one or more embodiments, the controller causes the processing chamber to perform the operations of depositing a metal layer by PVD on a substrate surface having at least one feature therein (operation 12). The at least one feature comprises at least one surface defining a via having a bottom surface and at least one sidewall. In one or more embodiments, the controller causes the processing chamber to deposit a nucleation layer on the metal layer (operation 14). In one or more embodiments, the controller causes the processing chamber to expose the device to a plasma to etch the nucleation layer (operation 16). In one or more embodiments, the controller causes the processing chamber to deposit a second metal layer on the nucleation layer by PVD (operation 18). In one or more embodiments, the controller causes the processing chamber to deposit a metal gapfill in the least one feature (operation 20).

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below," or "beneath" other elements or features would then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the materials and methods, and does not pose a limitation on the scope unless otherwise claimed. No language in the specification should be construed as indicating any non-claimed element as essential to the practice of the disclosed materials and methods.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. In one or more embodiments, the particular features, structures, materials, or characteristics are combined in any suitable manner.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method of forming a logic device, the method comprising:
    depositing a first metal layer on a substrate surface by physical vapor deposition (PVD), the substrate surface comprising at least one feature extending a depth from the substrate surface to a bottom and having two sidewalls;
    exposing the first metal layer to a nucleation presoak to form a nucleation layer on the first metal layer;
    exposing the nucleation layer to a plasma to etch the nucleation layer;
    depositing a second metal layer on the nucleation layer by physical vapor deposition (PVD); and
    depositing a metal gapfill on the second metal layer to fill the at least one feature and form a metal stack.

2. The method of claim 1, wherein the at least one feature has an aspect ratio of at least 5:1.

3. The method of claim 1, wherein the first metal layer, the second metal layer, and the metal gapfill comprise tungsten (W).

4. The method of claim 1, wherein the nucleation presoak comprises a silicon compound.

5. The method of claim 4, wherein the nucleation presoak consists essentially of silane ($SiH_4$).

6. The method of claim 1, wherein the nucleation presoak comprises a boron compound.

7. The method of claim 6, wherein the nucleation presoak consists essentially of diborane ($B_2H_6$).

8. The method of claim 1, wherein the nucleation layer comprises one to two monolayers of silicon and/or boron.

9. The method of claim 1, wherein the first metal layer forms an overhang into the at least one feature, the overhang having an average thickness of about 50 Å.

10. The method of claim 1, wherein the metal gapfill is deposited by atomic layer deposition (ALD).

11. The method of claim 1, wherein the metal gapfill is deposited by chemical vapor deposition (CVD).

12. The method of claim 1, wherein the metal gapfill is formed directly on the second metal layer.

13. The method of claim 1, wherein the nucleation layer does not increase resistance of the metal stack.

14. The method of claim 9, wherein the plasma removes at least a portion of the overhang.

15. A method of forming a semiconductor device, the method comprising:
    depositing a first metal layer comprising tungsten (W) on a substrate surface by physical vapor deposition (PVD), the substrate surface comprising at least one feature extending a depth from the substrate surface to a bottom and having two sidewalls;
    exposing the first metal layer to a nucleation presoak comprising boron to form a boron nucleation layer;
    exposing the boron nucleation layer to a plasma to etch the boron nucleation layer;
    depositing a second metal layer comprising tungsten (W) on the boron nucleation layer by physical vapor deposition (PVD); and
    depositing a metal gapfill comprising tungsten (W) on the second metal layer to fill the at least one feature and form a metal stack.

16. The method of claim 15, wherein the boron nucleation layer comprises one to two monolayers of boron on average.

17. The method of claim 15, wherein the first metal layer forms an overhang into the at least one feature, the overhang having an average thickness of about 50 Å.

18. The method of claim 17, wherein the plasma removes at least a portion of the overhang.

19. The method of claim 15, wherein the nucleation presoak comprises a boron compound.

20. The method of claim 15, wherein the nucleation presoak consists essentially of diborane ($B_2H_6$).

* * * * *